United States Patent
Lee et al.

(10) Patent No.: US 7,813,542 B2
(45) Date of Patent: Oct. 12, 2010

(54) WAFER ALIGNING APPARATUS AND RELATED METHOD

(75) Inventors: Heok-Jae Lee, Suwon-si (KR); Sang-Ho Kim, Yongin-si (KR); Hyu-Rim Park, Suwon-si (KR); Do-In Bae, Changwon-si (KR); Kee-Weone Seo, Suwon-si (KR); Chang-Woo Woo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 962 days.

(21) Appl. No.: 11/641,870

(22) Filed: Dec. 20, 2006

(65) Prior Publication Data

US 2007/0189596 A1    Aug. 16, 2007

(30) Foreign Application Priority Data

Feb. 13, 2006    (KR) .................. 10-2006-0013557

(51) Int. Cl.
*G06K 9/00* (2006.01)
*G06K 9/68* (2006.01)
*H04N 7/18* (2006.01)

(52) U.S. Cl. .................. 382/151; 382/218; 348/87; 348/95; 414/936

(58) Field of Classification Search .......... 382/151, 382/218; 348/87, 95; 414/936
See application file for complete search history.

(56) References Cited

U.S. PATENT DOCUMENTS

| 5,524,131 | A  | * | 6/1996  | Uzawa et al. ............. 378/34 |
| 5,690,744 | A  |   | 11/1997 | Landau |
| 5,696,835 | A  | * | 12/1997 | Hennessey et al. .......... 382/141 |
| 5,831,181 | A  | * | 11/1998 | Majumdar et al. ........... 73/863 |
| 5,905,850 | A  | * | 5/1999  | Kaveh ...................... 700/259 |
| 5,917,601 | A  |   | 6/1999  | Shimazaki et al. |
| 6,040,585 | A  |   | 3/2000  | Hsiao |
| 6,546,307 | B1 |   | 4/2003  | Hsiao |
| 2002/0196336 | A1 | * | 12/2002 | Batson et al. .............. 348/86 |
| 2003/0167102 | A1 | * | 9/2003  | Johnson et al. ............ 700/218 |
| 2004/0258514 | A1 | * | 12/2004 | Raaijmakers .............. 414/935 |
| 2005/0140960 | A1 |   | 6/2005  | Hazenberg et al. |
| 2007/0036535 | A1 | * | 2/2007  | Chee ....................... 396/153 |

\* cited by examiner

*Primary Examiner*—Bhavesh M Mehta
*Assistant Examiner*—Kathleen S Yuan
(74) *Attorney, Agent, or Firm*—Volentine & Whitt, PLLC (57) ABSTRACT

Embodiments of the invention provide a wafer aligning apparatus and a wafer aligning method. In one embodiment, the wafer aligning apparatus comprises an imaging unit adapted to take an image of a wafer being transferred from a load lock chamber to a transfer chamber and adapted to convert the image into digital signals, and a signal processing unit adapted to calculate a center alignment correction value for the wafer by comparing the digital signals to a master image stored in the signal processing unit. The wafer aligning apparatus further comprises a robot controller adapted to receive the center alignment correction value from the signal processing unit and adapted to control a transfer robot in accordance with the center alignment correction value to provide the wafer to a process chamber such that the center of the wafer is substantially aligned.

19 Claims, 7 Drawing Sheets

WAFER ALIGNING APPARATUS AND RELATED METHOD

BACKGROUND OF THE INVENTION

1. Technical Field

Embodiments of the invention relate to a wafer aligning apparatus. In particular, embodiments of the invention relate to a wafer aligning apparatus adapted to load a wafer into a process chamber such that the center of the wafer is aligned and a related method.

This application claims priority to Korean Patent Application No. 10-2006-0013557, filed Feb. 13, 2006, the subject matter of which is hereby incorporated by reference in its entirety.

2. Description of Related Art

In general, semiconductor devices are fabricated by sequentially performing a series of unit processes, such as photolithography, vapor deposition, etching, diffusion, metal wiring, and ion implantation. A unit process apparatus adapted to perform a unit process on wafers comprises a process chamber that performs the unit process of that unit process apparatus on a wafer, and a load lock chamber that temporarily stores the wafer before it is loaded into the process chamber and after it is unloaded from the process chamber. The unit process apparatus also comprises a transfer chamber connected to both the process chamber and the load lock chamber, and the transfer chamber comprises a wafer transfer robot that transfers the wafer between the process chamber and the load lock chamber.

Further, wafers are supplied to the load lock chamber in units of lots comprising about twenty five or twenty six wafers stacked in a cassette. In addition, the wafers are supplied from the load lock chamber to the process chamber one at a time.

Additionally, each unit process apparatus comprises an aligning chamber that aligns a wafer one final time before the wafer is loaded into a process chamber. The wafer alignment required to perform each unit process comprises not only the alignment performed in the aligning chamber, but also flat zone alignment, which is performed on wafers in units of cassettes before the cassettes are supplied to the load lock chamber.

However, even if flat zone alignment is performed on the wafers in a cassette before those wafers are provided to a unit process apparatus, the cassette in which the wafers are stacked is manually placed in a load lock chamber of the unit process apparatus by an engineer or a skilled person. Thus, the wafers stacked in the cassette may be moved minutely and misaligned when the cassette is moved or when it is placed in a load lock chamber. Thus, flat zone alignment is performed on wafers in units of cassettes before the wafers are provided to a unit process apparatus, and, in each unit process apparatus, each wafer passes through an aligning chamber before it is provided to the process chamber so that the wafer will be provided to the process chamber precisely aligned.

However, a relatively small amount of time is spent performing a unit process on a wafer in a unit process apparatus, while a relatively large amount of time is spent supplying the wafer to a process chamber. This difference is a principal factor that reduces the productivity of a unit process apparatus.

In particular, in a unit process apparatus, each wafer that is transferred from a load lock chamber to a process chamber must pass through an aligning chamber before it is provided to the process chamber, which increases wafer transfer time and thereby reduces the productivity of the unit process apparatus.

SUMMARY OF THE INVENTION

Embodiments of the invention provide a wafer aligning apparatus and a related wafer aligning method, wherein the wafer aligning apparatus is adapted to align the center of the wafer as the wafer is loaded into a process chamber when certain conditions are met. In addition, embodiments of the invention provide a wafer aligning apparatus and a wafer aligning method capable of reducing process execution time by, when certain conditions are met, aligning the center of a wafer withdrawn from a load lock chamber while the wafer is being transferred to a process chamber without providing the wafer to an aligning chamber. Additionally, embodiments of the invention provide a wafer aligning apparatus having relatively few structural differences relative to a conventional unit process apparatus to promote mounting of the wafer aligning apparatus.

In one embodiment, the invention provides a wafer aligning apparatus comprising an imaging unit adapted to take an image of a wafer being transferred from a load lock chamber to a transfer chamber and adapted to convert the image into digital signals, and a signal processing unit adapted to calculate a center alignment correction value for the wafer by comparing the digital signals to a master image stored in the signal processing unit. The wafer aligning apparatus further comprises a robot controller adapted to receive the center alignment correction value from the signal processing unit and adapted to control a transfer robot in accordance with the center alignment correction value to provide the wafer to a process chamber such that the center of the wafer is substantially aligned.

In another embodiment, the invention provides a wafer aligning apparatus comprising a laser sensor adapted to generate a trigger signal; an illuminator adapted to illuminate a wafer being transferred by a transfer robot from a cassette disposed in a load lock chamber to a transfer chamber, wherein the illuminator is adapted to illuminate the wafer in accordance with the trigger signal; and a Charge-Coupled Device (CCD) camera adapted to take an image of the wafer in accordance with the trigger signal and adapted to convert the image into digital signals. The wafer aligning apparatus further comprises a signal processing unit adapted to calculate a center alignment correction value for the wafer by comparing the digital signals to a master image stored in the signal processing unit; and a robot controller adapted to receive the center alignment correction value from the signal processing unit and control movement of a transfer robot in accordance with the center alignment correction value.

In another embodiment, the invention provides a wafer aligning method for aligning a wafer using a wafer aligning apparatus, the wafer aligning apparatus comprising a laser sensor adapted to generate a trigger signal; an illuminator adapted to illuminate a wafer being transferred by a transfer robot from a cassette disposed in a load lock chamber to a transfer chamber, wherein the illuminator is adapted to illuminate the wafer in accordance with the trigger signal; a Charge-Coupled Device (CCD) camera adapted to take an image of the wafer in accordance with the trigger signal and adapted to convert the image into digital signals. The wafer aligning apparatus further comprises a signal processing unit adapted to calculate a center alignment correction value for the wafer by comparing the digital signals to a master imaged stored in the signal processing unit; and a robot controller adapted to receive the center alignment correction value from the signal processing unit and control movement of the transfer robot in accordance with the center alignment correction value. The wafer aligning method comprises withdrawing the wafer from the cassette using the transfer robot, generating the trigger signal using the laser sensor when the wafer is being transferred from the cassette disposed in the load lock chamber to the transfer chamber, taking an image of the wafer disposed on the transfer robot in accordance with the generation of the trigger signal, converting the image of the wafer into digital signals, and detecting coordinates of a first apex of a flat zone of the wafer image, and detecting a flat zone angle of the wafer image. The method further comprises calculating a flat zone angle difference between respective flat zone angles of the wafer image and the master image by comparing the digital signals with the master image, calculating coordinates of a center of a wafer image, calculating a wafer center difference, and comparing the wafer center difference to a stored first limit and comparing the flat zone angle difference to a stored second limit. The method still further comprises providing the wafer to an aligning chamber using the transfer robot, aligning the wafer, and providing the wafer to the process chamber as aligned if the wafer center difference exceeds the first limit or the flat zone angle difference exceeds the second limit. The method also comprises calculating a center alignment correction value for the transfer robot in accordance with the wafer center difference, and controlling the movement of the transfer robot in accordance with the center alignment correction value to load the wafer into the process chamber such that the center of the wafer is substantially aligned if the wafer center difference is below the first limit and the flat zone angle is below the second limit.

BRIEF DESCRIPTION OF THE DRAWINGS

Embodiments of the invention will be described herein with reference to the accompanying drawings, in which like reference symbols indicate like or similar elements throughout. In the drawings.

DESCRIPTION OF EMBODIMENTS

Figure 1:
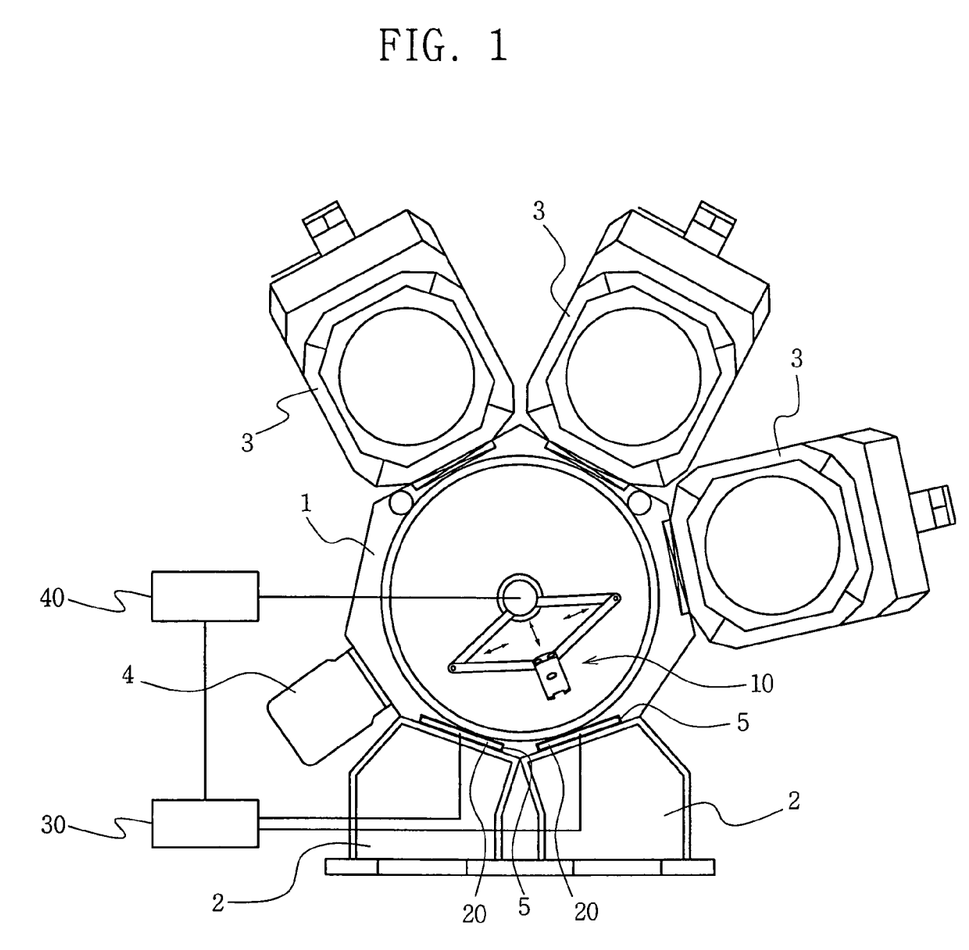
FIG. 1 is a plan view of a unit process apparatus comprising a wafer aligning apparatus in accordance with an embodiment of the invention.

FIG. 1 is a plan view of a unit process apparatus comprising a wafer aligning apparatus in accordance with an embodiment of the invention.

In the embodiment illustrated in FIG. 1, a transfer chamber 1 comprises a transfer robot 10, load lock chambers 2 are disposed on a first side of transfer chamber 1, and process chambers 3, which perform substantive processes (i.e., unit processes), are disposed on a second side of transfer chamber 1 opposite load lock chambers 2. In addition, an aligning chamber 4 that may used to align a wafer before it is loaded into a process chamber 3 is disposed between one of the load lock chambers 2 and one of the process chambers 3 around the outside of transfer chamber 1. Though multiple load lock chambers 2 and process chambers 3 are shown in FIG. 1, for convenience of description, only one of the load lock chambers 2 (i.e., "load lock chamber 2") and only one of the process chambers 3 (i.e., "process chamber 3") will generally be referred to hereinafter in the description of embodiments.

Wafers are placed in a load lock chamber 2 in units of cassettes (i.e., lots). In general, twenty five or twenty six wafers are stacked in a cassette, and, for each wafer stacked in the cassette, transfer robot 10 of transfer chamber 1 is adapted to withdraw the wafer stacked in the cassette disposed in load lock chamber 2 and transfer the wafer to process chamber 3 in which a process will be performed on the wafer. Transfer robot 10 withdraws and transfers wafers one at a time. In addition, while a wafer W is being withdrawn and transferred it is disposed on transfer robot 10.

Before a cassette is placed in load lock chamber 2, flat zone alignment is performed on the wafers disposed in the cassette using a flat zone aligner (not shown). In general, after the wafers of a cassette have undergone flat zone alignment, the cassette is transferred directly to a unit process apparatus by an engineer and placed in a load lock chamber 2. However, in more recent facilities, the cassette is often transferred automatically by an automatic transfer line.

In the embodiment illustrated in FIG. 1, once a cassette has been placed in load lock chamber 2, wafers are withdrawn from the cassette and transferred to transfer chamber 1 one at a time. In accordance with an embodiment of the invention, an image of a wafer that is being transferred from load lock chamber 2 to transfer chamber 1 by transfer robot 10 is taken at a predetermined point in time. Then, a wafer center difference (i.e., the displacement of the center of the image of the wafer) is calculated, and the movement (i.e., a position) of transfer robot 10 is then controlled in accordance with a center alignment correction value corresponding to the wafer center difference to thereby place the wafer in process chamber 3 such that the wafer is substantially centered (i.e., the center of the wafer is substantially aligned) when the wafer is placed in process chamber 3. The wafer center difference and the center alignment correction value may each be expressed as coordinates comprising components along orthogonal axes.

The unit process apparatus of FIG. 1 comprises an imaging unit 20 and a signal-processing unit 30. Signal processing unit 30 compares a wafer image (i.e., digital signals of a wafer image) taken by imaging unit 20 with a master image that is stored in signal processing unit 30 and then calculates a center alignment correction value for the wafer corresponding to the wafer image. The center alignment correction value is then provided (i.e., fed back) to a robot controller 40, and robot controller 40 controls the driving of transfer robot 10, which transfers a wafer to process chamber 3. An image of a wafer may be referred to herein as a "wafer image".

More specifically, imaging unit 20 takes an image of a wafer that is being transferred from load lock chamber 2 to transfer chamber 1 at a predetermined point in time and then converts the wafer image into digital signals. Transfer robot 10, which is at least partially disposed inside of transfer chamber 1, is adapted to transfer the wafer, and when transfer robot 10 transfers a wafer, the wafer is disposed on a blade of transfer robot 10. Thus, imaging unit 20 takes an image of a wafer being transferred while it is disposed on.

Imaging unit 20 may comprise a camera. In particular, imaging unit 20 may comprise a CCD (Charge-Coupled Device) camera, which can take an image of a wafer that is being transferred at a high speed. In addition, imaging unit 20 may comprise a laser sensor, which is separate from the CCD camera and may be used to detect a point in time at which the CCD camera is to take an image of a wafer. The laser sensor is adapted to detect the amount of light reflected after a portion of an object is scanned with light. In the embodiment illustrated in FIG. 1, the laser sensor is adapted to detect a substantial (i.e., sharp) change in the amount of light reflected by transfer robot 10 as it moves under the laser sensor, and is adapted to generate a trigger signal in accordance with that change. A robot arm of transfer robot 10 is coupled to a blade of transfer robot 10 by a coupler, and the blade, the coupler, and a portion of the robot each pass under the laser sensor. The laser sensor may detect a substantial change in the amount of light reflected by an object passing below the laser sensor when a boundary separating elements of transfer robot 10 made of different materials and having different colors passes under the laser sensor. In addition, the CCD camera is adapted to take an image of a wafer in accordance with the trigger signal, and, in accordance with an embodiment of the invention, the trigger signal may indicate a point in time at which the CCD camera is to take an image of the wafer.

That is, the laser sensor is adapted to scan objects that pass through a predetermined portion of a passageway through which a wafer is transferred by transfer robot 10, and a portion of transfer robot 10 passes through that predetermined portion. The laser sensor will detect a substantial change in the amount of light reflected by an object passing under it when the boundary between the robot arm and the blade of transfer robot 10 passes under the laser sensor.

In accordance with an embodiment of the invention, imaging unit 20 is adapted to generate a trigger signal when a substantial change in the amount of light reflected by the transfer robot 10 is detected, and is also adapted to take an image of a wafer using a CCD camera after a predetermined amount of time has lapsed since the trigger signal was generated or after the wafer has moved a predetermined distance since the trigger signal has was generated.

In the embodiment illustrated in FIG. 1, imaging unit 20 is mounted on an outer peripheral face of a slit valve door module 5 disposed between load lock chamber 2 and transfer chamber 1.

Figure 2:
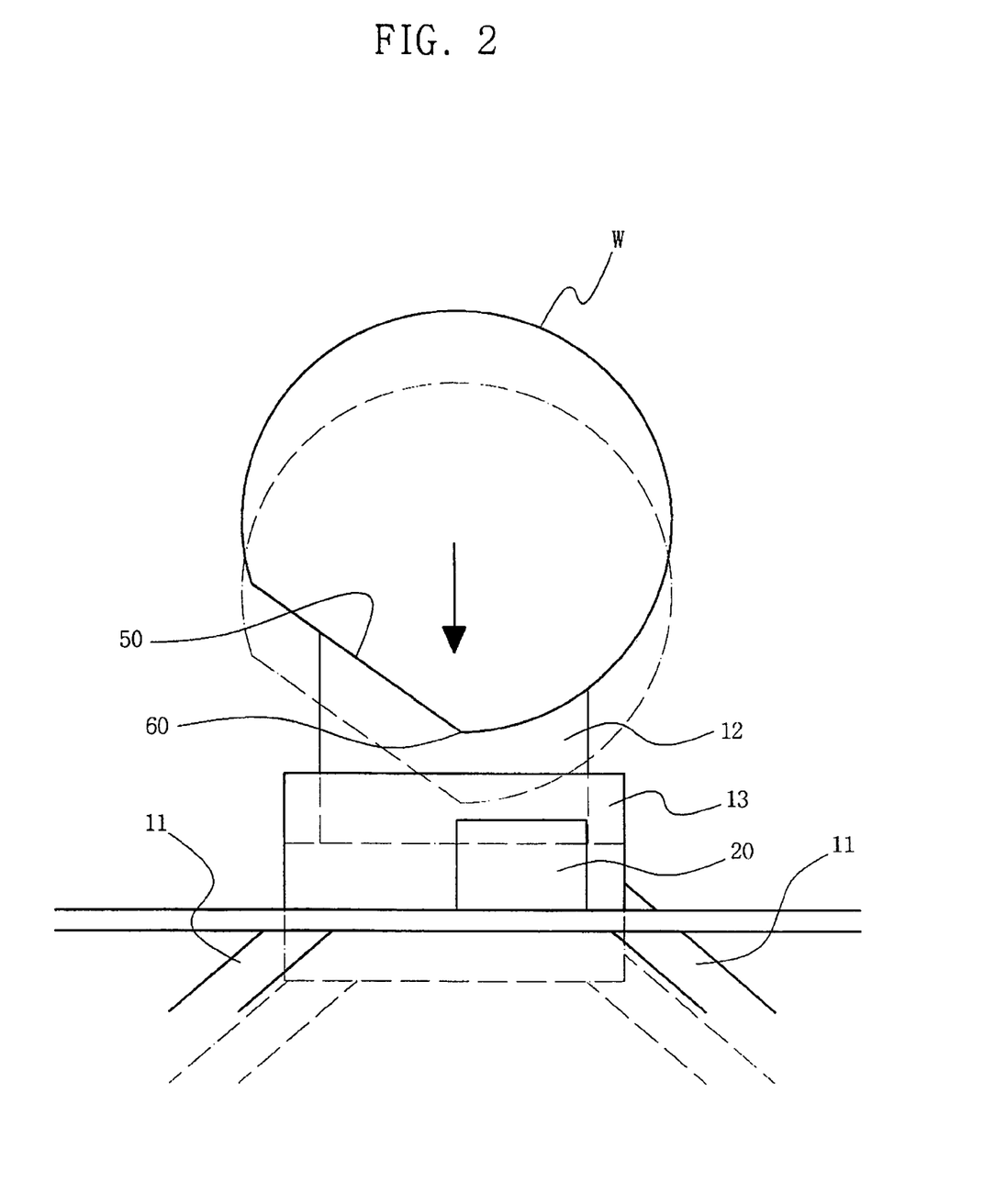
FIG. 2 is a plan view showing a wafer being moved by a transfer robot in accordance with an embodiment of the invention.

FIG. 2 is a plan view showing a wafer being moved by transfer robot 10 in accordance with an embodiment of the invention.

As shown in FIG. 2, wafer W is transferred by transfer robot 10 (of FIG. 1) in an orientation in which a flat zone 50 of wafer W is inclined at an angle of about 20° relative to a line that is perpendicular to the direction in which wafer W is moving (i.e., perpendicular to the arrow illustrated in FIG. 2) and that passes through apex 60 of flat zone 50. The angle at which flat zone 50 is inclined with reference to such a line may be referred to herein as a "flat zone angle" or the "angle of the flat zone". In the embodiment illustrated in FIG. 2, apex 60 of wafer W is the first portion of wafer W to pass under imaging unit 20 (i.e., to pass through an imaging position).

However, before wafer W passes under imaging unit 20, imaging unit 20 detects a substantial change in the amount of light reflected from transfer robot 10 when a boundary between robot arm 11 and coupler 13 of transfer robot 10, which are formed from different materials, passes under imaging unit 20 a part. Thus, imaging unit 20 generates a trigger signal when it detects that change, and imaging unit 20 is adapted to take an image of the wafer in accordance with the generation of the trigger signal. In the embodiment illustrated in FIG. 2, imaging unit 20 takes an image of wafer W (which is being transferred), imaging unit 20 generates the trigger signal as a preparation signal prior to generating an imaging operation signal.

Coupler 13 couples robot arm 11 to blade 12, and imaging unit 20 is adapted to generate the trigger signal when a boundary between robot arm 11 and coupler 13 passes under imaging unit 20. In the embodiment illustrated in FIG. 2, the color of robot arm 11 is significantly different than the color of coupler 13. That is, robot arm 11 is made of white aluminum, whereas coupler 13 is subjected to black anodizing. Therefore, the robot arm and coupler have clearly different colors.

Such a position where color changes sharply is set as a trigger signal generation point of time or a trigger point generation position, and an imaging operation signal (signaling imaging unit 20 to perform an imaging operation) is generated after a predetermined amount of time has lapsed from this time when the trigger signal was generated or after wafer W has moved a predetermined distance after the trigger signal was generated.

If an imaging operation is performed after a delay of predetermined amount of time has passed since the generation of the trigger signal or after wafer W has moved predetermined distance since the time at which the trigger signal was generated, it is possible to take an image of wafer W at an exact and predetermined position (i.e. it is possible to take an image of wafer W that includes less area peripheral to wafer W). Alternatively, an image of a wafer W may be taken immediately upon the generation of the trigger signal without a delayed of a predetermined amount of time or a delay of the amount of time it takes for wafer W to move a predetermined distance.

Once imaging unit 20 takes a wafer image of wafer W, imaging unit 20 converts the wafer image into digital signals and provides the digital signals to signal processing unit 30. Signal processing unit 30 is adapted to receive the wafer image taken by imaging unit 20 (i.e., the digital signals) and calculate the coordinates of the center of the received wafer image in accordance with a stored calculation method. It is noted herein that the size of wafers in semiconductor fabrication processes are standardized.

Figure 3:
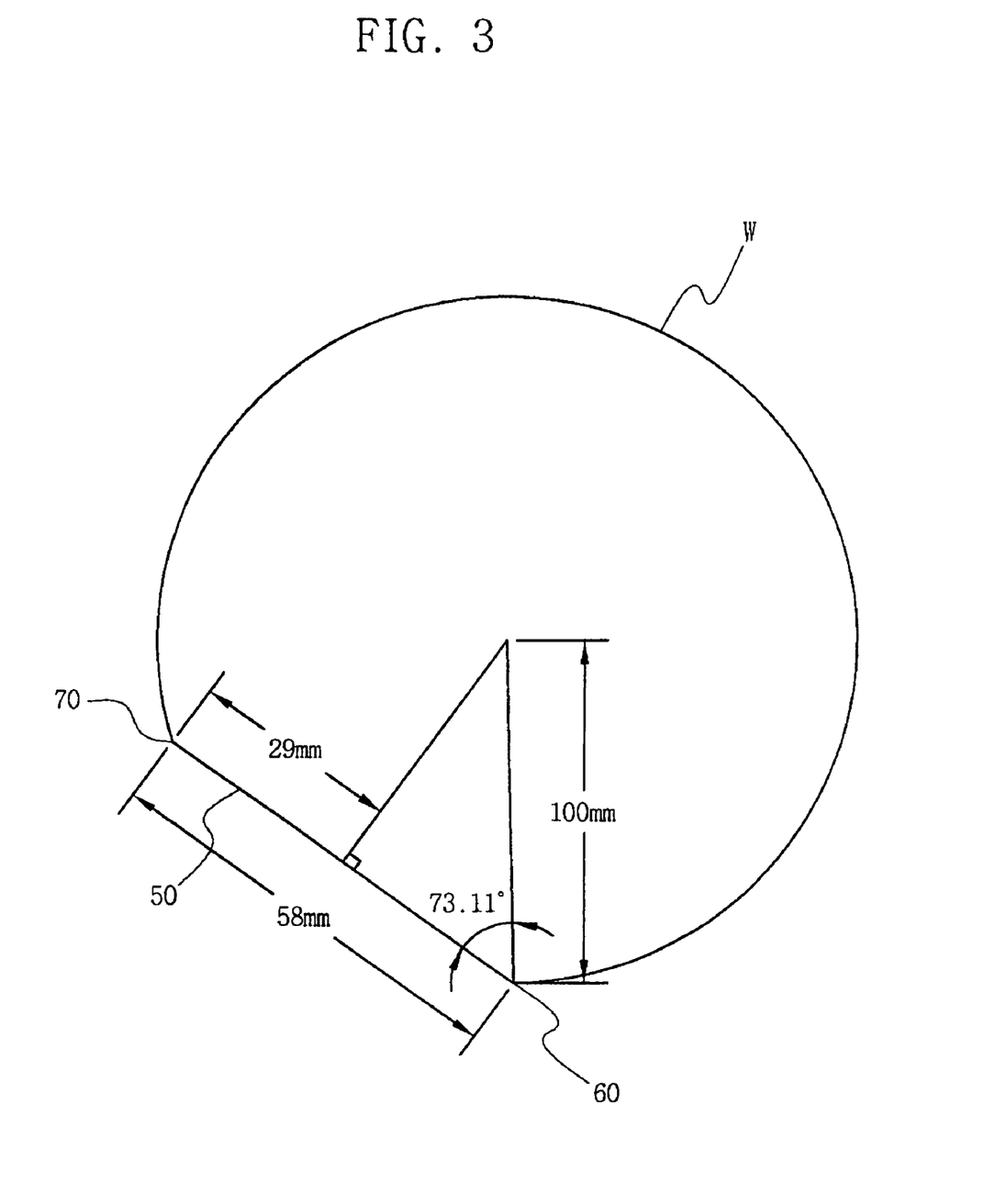
FIG. 3 is a plan view illustrating a typical wafer.

FIG. 3 is a plan view illustrating a typical wafer W. Wafer W of FIG. 3 has a diameter of 200 mm, the length of flat zone 50 of wafer W is 58 mm, and the distance from an apex 60 of flat zone 50 to the center of wafer W (i.e., the radius of wafer W) is 100 mm. Accordingly, wafer W has a standard size and shape in which the distance from the middle flat zone 50 (a position having a distance of 29 mm from apex 60 and apex 70) to the center of the wafer W is 95.7 mm. In addition, the angle formed by a line connecting apex 60 to the center of wafer W and flat zone 50 (i.e., a line connecting apex 60 to the middle of flat zone 50) is 73.11°.

Imaging unit 20 takes an image of wafer W comprising apex 60 of flat zone 50 and only a portion of flat zone 50 of wafer W. In FIG. 2, imaging unit 20 takes an image of a portion of wafer W.

Imaging unit 20 takes an image of wafer W (i.e., a portion of wafer W) when wafer W is disposed at an imaging position, and signal processing unit 30 stores an optimal alignment state for a wafer disposed at the imaging position. Signal processing unit 30 stores the optimal alignment state as a master image learned through a teaching technique. In addition, signal processing unit 30 compares the master image with the wafer image taken by imaging unit 20 to calculate a wafer center difference between wafer W and the master image, which is the difference in position between the center of the master image and the center of wafer W. That is, signal processing unit 30 checks the coordinates of an apex of a flat zone and the angle of the flat zone in the master image in order to perform an operation to determine the difference in position between the center of a wafer W and the center of the master image.

In this way, signal processing unit 30 calculates the coordinates of apex 60 of wafer W, a flat zone angle difference for wafer W, and a wafer center difference for wafer W, all with respect to the master image, by comparing the wafer image of wafer W with the master image in order to generate and provide a center alignment correction value to robot controller 40.

Robot controller 40 is adapted to control the movement of transfer robot 10 in accordance with the center alignment correction value received from signal processing unit 30 so that wafer W is supplied to process chamber 3 such that the center of wafer W is aligned. That is, if the center of wafer W is not aligned before it is provided to process chamber 3, robot controller 40 alters the normal driving of transfer robot 10 in accordance with the center alignment correction value.

Figure 4:
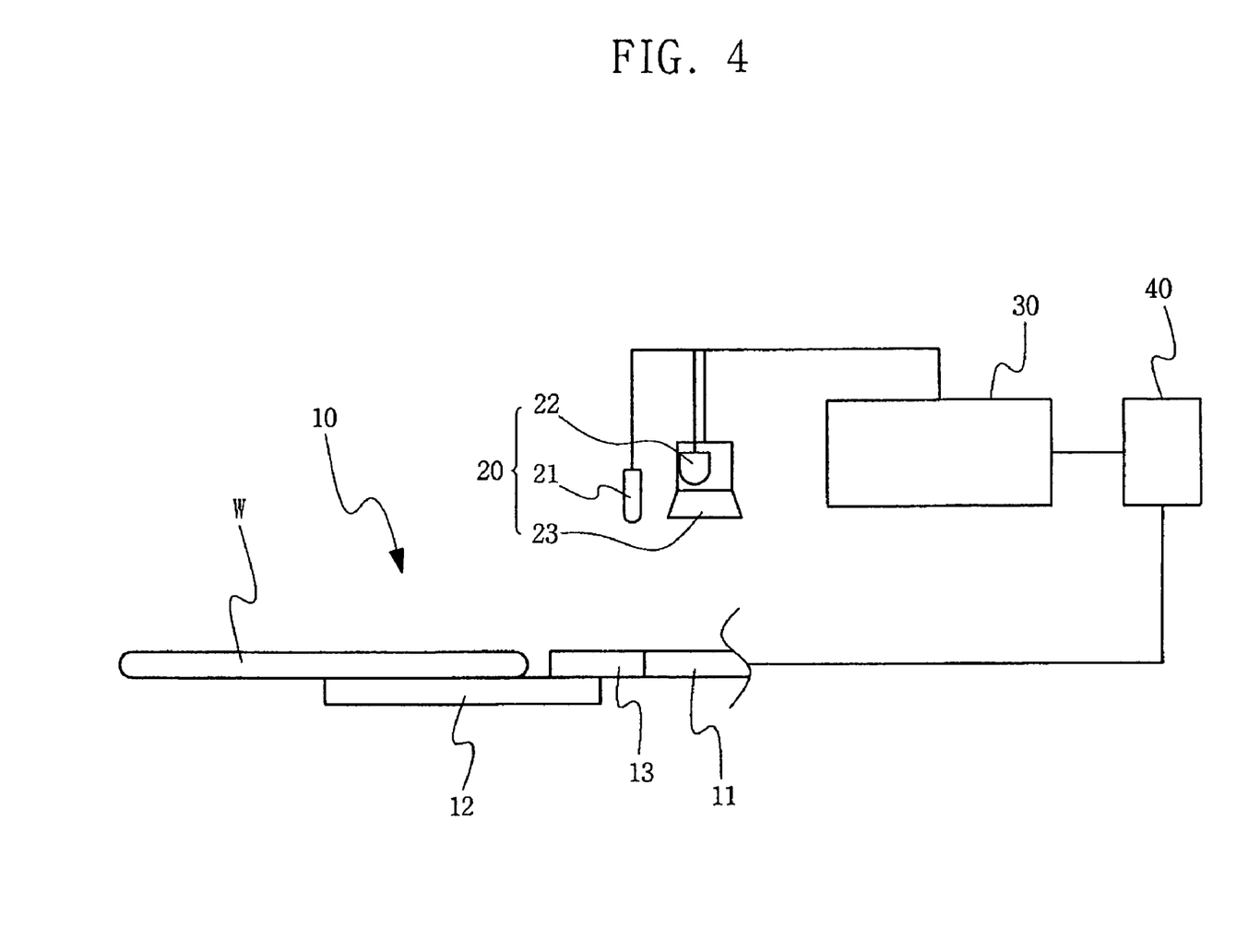
FIG. 4 is a structural view showing a wafer aligning apparatus in accordance with an embodiment of the invention.

FIG. 4 is a structural view showing a wafer aligning apparatus in accordance with an embodiment of the invention. In the drawings, like reference symbols refer to like or similar elements.

In the embodiment illustrated in FIG. 4, imaging unit 20 comprises a laser sensor 21, an illuminator 22, and a CCD camera 23. In addition, an image of a wafer W (i.e., a wafer image) is taken while wafer W is being transferred from load lock chamber 2 to transfer chamber 1 (of FIG. 1). A center alignment correction value for wafer W is then calculated by comparing the wafer image corresponding to wafer W with a master image stored in signal processing unit 30. Transfer robot 10 then supplies wafer W to a process chamber 3 such that the center of wafer W is substantially aligned.

In more detail, laser sensor 21 is adapted to generate a trigger signal in accordance with a substantial change in the amount of light reflected from an object, as detected by laser sensor 21, and imaging unit 20 is adapted to take an image of wafer W in accordance with the trigger signal. In addition, laser sensor 21 is adapted to radiate light onto an object and is adapted to generate an imaging operation signal.

Laser sensor 21 is disposed on an outer peripheral face of the slit valve door module 5 between a load lock chamber 2 and transfer chamber 1. In particular, laser sensor 21 may be disposed on a window of the slit valve door module 5.

If laser sensor 21 is disposed on the window, laser sensor 21 can radiate light through the window onto an object being detected, and detect the light reflected from the object, without the need for a separate component for mounting laser sensor 21. In transfer robot 10, which transfers a wafer W, robot arm 11 and coupler 13, which couples robot arm 11 with blade 12, have different colors. That is, robot arm 11 and blade 12 of transfer robot 10 are made of a white aluminum material (i.e., robot arm 11 and blade 12 are white), whereas coupler 13, which couples robot arm 11 to blade 12, is subjected to black anodizing (i.e., coupler 13 is black). Because robot arm 11 and coupler 13 are different colors, laser sensor 21 is able to detect a substantial change in the amount of light reflected from transfer robot 10 when a boundary between the robot arm 11 and coupler 13 passes under laser sensor 21. When laser sensor 21 detects this substantial change it generates a trigger signal.

Illuminator 22 is adapted to illuminate a wafer brightly so that an image of wafer W can be taken, and illuminator 22 is operated in accordance with the trigger signal generated by laser sensor 21. Illuminator 22 may begin to operate near the point in time at which imaging unit 20 takes an image of wafer W. Illuminator 22 may begin to operate when the trigger signal is generated. Alternatively, illuminator 22 may begin to operate after a predetermined amount of time has lapsed since the generation of the trigger signal or after wafer W has moved a predetermined distance since the generation of the trigger signal.

Illuminator 22 and laser sensor 21 may be disposed on an outer peripheral face of the slit valve door module 5 disposed between load lock chamber 2 and transfer chamber 1. In particular, illuminator 22 and laser sensor 21 may be disposed on a window of the slit valve door module 5. Further, illuminator 22 may comprise a flash lamp adapted to generate bright light instantaneously but for only a very short amount of time.

CCD camera 23, which may operate together with illuminator 22, is a high-speed imaging camera which is adapted to take an image of a wafer W that is being transferred by transfer robot 10 at a predetermined point of time and convert the image of wafer W (i.e., the wafer image) into digital signals. More specifically, CCD camera 23 is adapted to take an image of wafer W in accordance with a trigger signal generated by laser sensor 21 at a predetermined point in time and is adapted to convert the image of wafer W (i.e., the wafer image) into digital signals. CCD camera 23, along with laser sensor 21 and illuminator 22, may be disposed on an outer peripheral face of slit valve door module 5, which is disposed between load lock chamber 2 and transfer chamber 1. In particular, illuminator 22, laser sensor 21, and CCD camera 23 may be disposed on a window of slit valve door module 5.

That is, laser light that is radiated through the window of slit valve door module 5, laser light that is reflected back through the window of slit valve door module 5 is detected by laser sensor 21, and an image of a wafer W that is being transferred is taken through the window by CCD camera 23 while wafer W is illuminated brightly by illuminator 22. The image of wafer W taken by CCD camera 23 is then converted into digital signals by CCD camera 23 and transmitted to signal processing unit 30.

Signal processing unit 30 is adapted to calculate a center alignment correction value for wafer W by comparing the digital signals corresponding to the wafer image of wafer W received from CCD camera 23 with a stored master image. That is, similar to a process described above, signal processing unit 30 stores as a mater image (learned through a teaching technique) an image of a wafer having a center that is substantially aligned as it is withdrawn from load lock chamber 2, and signal processing unit 30 compares the digital signals corresponding to the wafer image received from CCD camera 23 with the master image.

Further, signal processing unit 30 compares the master image with the wafer image for wafer W (i.e., the digital signals) to calculate the coordinates of an apex 60 of a flat zone 50 of wafer W (see FIG. 3), a flat zone angle difference, and a wafer center difference for wafer W in accordance with equations for calculating a center alignment correction value.

Robot controller 40 is adapted to make a positional correction of transfer robot 10 at a predetermined position in accordance with the center alignment correction value for wafer W, which is calculated by signal processing unit 30 and provided to robot controller 40 by signal processing unit 30. That is, robot controller 40 makes a positional correction of transfer robot 10 at a predetermined position as much as a predetermined wafer center difference (i.e., distance of movement) by using the wafer center alignment value which has been calculated by signal processing unit 30 and provided to robot controller 40 so that wafer W can be supplied to process chamber 3 in a state in which the center of wafer W is substantially aligned.

In accordance with embodiments of the invention, when a wafer image corresponding to a wafer W that is being transferred is compared to the master image in the signal processing unit 30, if the wafer center difference for wafer W and the flat zone angle difference are each calculated as being zero, then the center alignment correction value is zero. Thus, wafer W is placed in process chamber 3 without positional correction being performed by transfer robot 10.

However, if signal processing unit 30 determines that at least one of the wafer center difference for wafer W and the flat zone angle difference exceeds a corresponding limit (i.e., a set change range) that has previously been set in signal processing unit 30, robot controller 40 controls transfer robot 10 to transfer wafer W to an aligning chamber 4 so that wafer W may be substantially aligned by aligning chamber 4, and then transfers wafer W to a process chamber 3.

A wafer aligning method using the apparatus illustrated in FIGS. 1 through 4 will be described below.

In the wafer aligning method, an image of a wafer W, which is substantially centered and aligned (i.e., has undergone centering and flat zone alignment) at a predetermined position where the image of the wafer W is taken, is stored as a master image in the signal processing unit 30. Further, a series of operation programs are stored in signal processing unit 30, wherein, by comparing a wafer image of a wafer W taken by imaging unit 20 and using the previously-mentioned programs, the coordinates of an apex of a flat zone of the wafer image corresponding to wafer W, a flat zone angle difference, and a wafer center difference may be calculated.

In addition, flat zone alignment is performed on a plurality of wafers W disposed in a cassette, and the cassette is then transferred to load lock chamber 2. Once the cassette is placed in load lock chamber 2, wafers W are withdrawn from load lock chamber 2 and supplied to a desired process chamber 3 one at a time using transfer robot 10 of transfer chamber 1.

Since the slit valve door module 5 is disposed between load lock chamber 2 and transfer chamber 1, and imaging unit 20 comprising laser sensor 21, illuminator 22, and CCD camera 23 is mounted on the window of the slit valve door module 5, imaging unit 20 is adapted to take an image of wafer W when it is disposed at a predetermined position as it passes through a slit of slit valve door module 5. In addition, illuminator 22 and CCD camera 23 of imaging unit 20 are operated in accordance with a trigger signal generated by laser sensor 21, and imaging unit 20 takes an image of wafer W in accordance with the generation of the trigger signal.

Illuminator 22 and CCD camera 23 may be operated simultaneously with the generation of the trigger signal. However, illuminator 22 and CCD camera 23 may be operated after a predetermined amount of time has lapsed since the generation of the trigger signal or after wafer W has moved a predetermined distance after the trigger signal was generated.

Further, although laser sensor 21 can be adapted to be always turned ON, wafers pass through the slit of slit valve door module 5 when they are being loaded into load lock chamber 2 as well as when they are being unloaded from load lock chamber 2. Thus, laser sensor 21 is preferably turned ON when a wafer is being unloaded from load lock chamber 2.

In accordance with embodiments of the invention, wafer alignment control may be performed when a wafer W is being withdrawn from a cassette in load lock chamber 2 by transfer robot 10 of transfer chamber 1 and transferred to process chamber 3.

Figure 5:
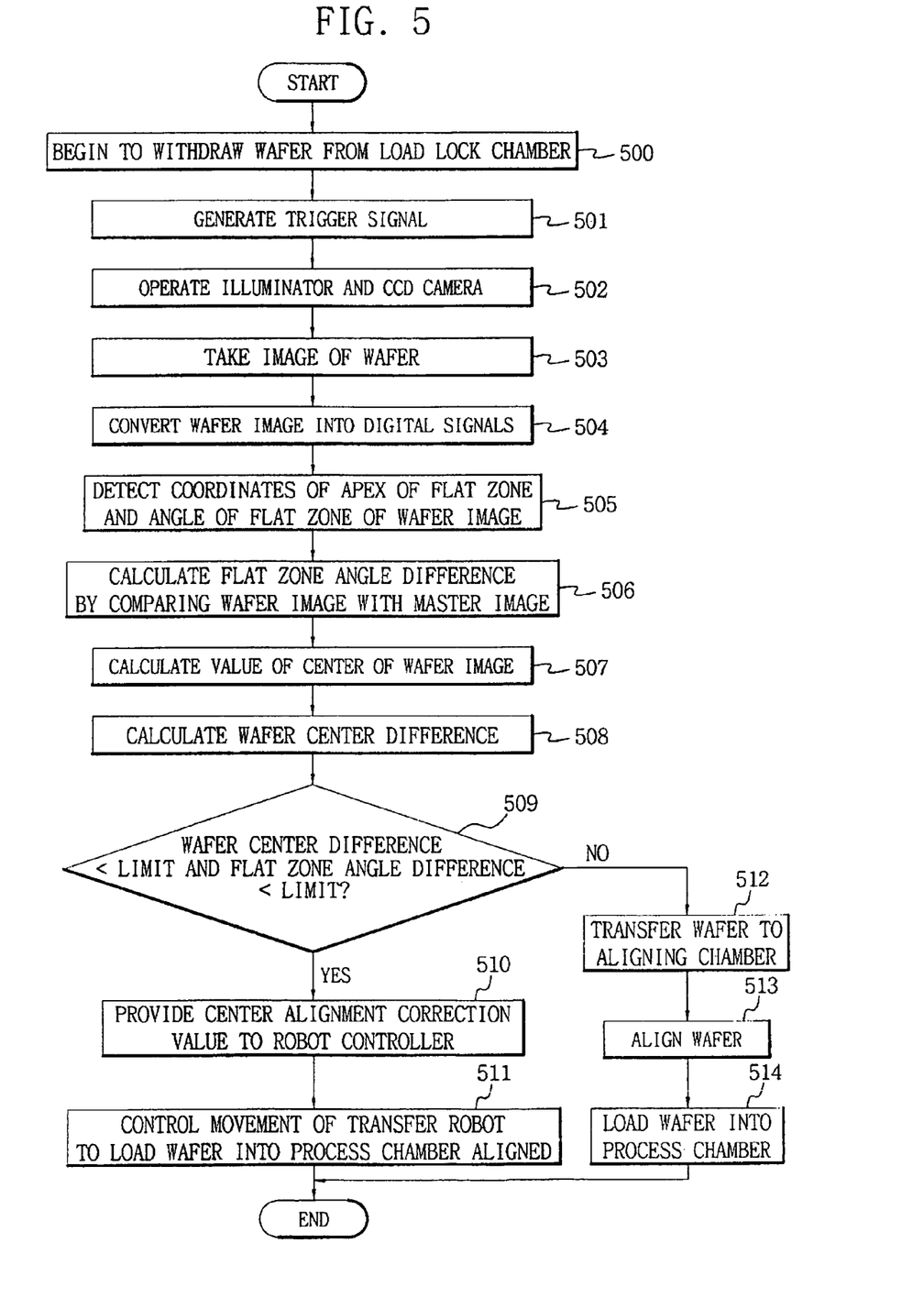
FIG. 5 is a flowchart showing a wafer aligning method in accordance with an embodiment of the invention.

FIG. 5 is a flowchart showing a wafer aligning process in accordance with an embodiment of the invention.

First, transfer robot 10 of transfer chamber 1 begins to withdraw a wafer W from a cassette disposed in a load lock chamber 2 to transfer wafer W to transfer chamber 1 (500). Then, as wafer W is being transferred, laser sensor 21 generates a trigger signal when laser sensor 21 detects a substantial change in the amount of light reflected by transfer robot 10 as it passes below laser sensor 21 (501). That is, as described previously, laser sensor 21 detects a substantial change in the amount of light reflected from transfer robot 10 when a boundary between robot arm 11 and coupler 13 of transfer robot 10 passes below laser sensor 21.

Next, illuminator 22 and CCD camera 23 are operated in accordance with the trigger signal (502). Illuminator 22 and CCD camera 23 may be operated simultaneously with the generation of the trigger signal. Alternatively, in order to obtain a more exact image of a wafer W (i.e., an image that is more precisely limited to wafer W), CCD camera 23 may begin preparing to take an image of wafer W when laser sensor 21 generates the trigger signal, and then take an image of wafer W after either a predetermined amount of time has lapsed since the generation of the trigger signal, or after wafer W has moved a predetermined distance since the trigger signal was generated. In particular, CCD camera 23 preferably takes an image of wafer W after a specified period of time has lapsed since the trigger signal was generated.

Thus, after a predetermined amount of time has lapsed since the generation of the trigger signal, or after wafer W has moved a predetermined distance since the generation of the trigger signal, wafer W is illuminated by illuminator 22, and CCD camera 23 takes an image of wafer W (503) (i.e., a wafer image).

After taking the wafer image of wafer W, CCD camera 23 immediately converts the wafer image into digital signals (504). CCD camera 23 then provides the digital signals to signal processing unit 30.

Then, signal processing unit 30 detects from the wafer image the coordinates of an apex 60 of a flat zone 50 of wafer W (see FIG. 3) and the angle (i.e., position) of flat zone 50 of wafer W (505) by comparing the wafer image (i.e., digital signals) corresponding to wafer W with the master image. The coordinates of apex 60 are defined in relation to a corresponding apex of the master image and represent a difference in position between apex 60 and the corresponding apex of the master image. The components of a wafer W (e.g., an apex, a flat zone, a center) and the corresponding components of a wafer image corresponding to wafer W, which represent the corresponding components of the wafer W, may be referred to herein interchangeably.

Next, signal processing unit 30 calculates a flat zone angle difference by comparing the wafer image with the master image (506). As used herein, the "flat zone angle difference" is the difference between the angle of the flat zone of wafer W, which is represented by the wafer image, and the angle of the flat zone of the master image (i.e., the angle of the flat zone of the wafer represented by the master image). Then, signal processing unit 30 calculates the coordinates of the center of the wafer image using equations stored in the signal processing unit 30 (507).

Signal processing unit 30 then calculates a wafer center difference (508). The wafer center difference is difference between the coordinates of the center of wafer W of the wafer image and the center of the master image (i.e., the center of the wafer represented by the master image).

It is very important that neither the wafer center difference nor the flat zone angle difference exceed corresponding predetermined limits. Transfer robot 10 has no function to rotate the wafer W horizontally, so, if the flat zone angle difference is greater than a predetermined limit, transfer robot 10 cannot place wafer W in process chamber 3 in a substantially aligned position, which may result in process errors. In addition, if the center of wafer W deviates excessively from blade 11, blade 11 of transfer robot 10 may collide with the slit of process chamber 11 even if the center of wafer W is aligned by transfer robot 10. Therefore, a limit for the wafer center difference and a limit for the flat zone angle difference are stored in signal processing unit 30 and robot controller 40.

Thus, it is then determined whether the wafer center difference and the flat zone angle difference are each less than their corresponding limits (509). If the wafer center difference and the flat zone angle difference are each determined to be less than their corresponding limits, then the wafer center difference is provided to robot controller 40 as the center alignment correction value (510). Robot controller 40 then uses the center alignment correction value to control movement (i.e., the position) of transfer robot 10 to load wafer W into a process chamber 3 such that the center of wafer W is substantially aligned (511). That is, the movement (i.e., position) of transfer robot 10 is controlled (i.e., corrected) in accordance with the wafer center difference provided to robot controller 40, and wafer W is supplied into a process chamber 3 in a state in which the center thereof is substantially aligned, wherein an alignment criterion when wafer W is supplied to process chamber 3 by transfer robot 10 is based on wafer W rather than blade 12.

Alternatively, if it is determined that the wafer center difference for wafer W is greater than a corresponding limit (e.g., about 3 mm in any single direction when wafer W has a diameter of 200 mm) stored in signal processing unit 30 or robot controller 40, or it is determined that the flat zone angle difference is greater than a corresponding limit (e.g., about 30 when wafer W has a diameter of 200 mm), robot controller 40 controls transfer robot 10 to provide wafer W, which has previously been withdrawn from load lock chamber 2, to an aligning chamber 4 (512). After transfer robot 10 provides wafer W to aligning chamber 4, aligning chamber 4 precisely aligns wafer W (513), and robot controller 40 then controls transfer robot 10 to provide wafer W to a process chamber 3 (514).

Since flat zone alignment is performed on the wafers W in a cassette before the wafers are provided to a unit process apparatus, most of wafers W show wafer center and flat zone angle differences that are within the corresponding limits stored in robot controller 40. However, the position of a wafer W in a cassette may be changed greatly by an external impact caused by careless handling while the cassette containing wafer W is being transferred to a load lock chamber 2 or while it is being placed in a load lock chamber 2. Thus, in order to prevent at least some process errors, wafer center and flat zone angle differences should be compared with the corresponding limits.

A process in which wafer center and flat zone angle differences are compared with corresponding limits may be performed in signal processing unit 30, or may be performed in robot controller 40. Preferably, the determination of the wafer center and flat zone angle differences and the comparison of those differences against the corresponding limits is performed in signal processing unit 30 before the wafer center difference is provided to robot controller 40 as a center alignment correction value. That is, if signal processing unit 30 determines whether a wafer W is to be supplied to an aligning chamber 4 or directly to a process chamber 3 before providing the wafer center difference to robot controller 40, robot controller 40 performs an operation in accordance with the determination made by signal processing unit 30. In particular, when signal processing unit 30 determines that a wafer W will be transferred directly to process chamber 3, then the wafer center difference is provided to robot controller 40 as a center alignment correction value and transfer robot 10 aligns the center of wafer W. Alternatively, signal processing unit 30 determines that wafer W will pass through aligning chamber 4, transfer robot 10 does not perform wafer center alignment.

Since an aligning chamber 4 (which is a very expensive piece of equipment) aligns wafers more exactly than transfer robot 10, the alignment of a wafer W performed by transfer robot 10 is preferably omitted if wafer W passes through aligning chamber 4 (i.e., aligning chamber 4 aligns wafer W).

In another embodiment of the invention, after signal processing unit 30 calculates the wafer center difference, signal processing unit 30 provides the wafer center difference to robot controller 40 as a center alignment correction value and robot controller 40 then compares the center alignment correction value with a previously stored limit to determine whether the correction value is within the range of the limit. If the center alignment correction value is within the range of the limit, then the movement of transfer robot 10 is controlled in accordance with the center alignment correction value to provide wafer W to the process chamber substantially aligned (i.e., the transfer position of transfer robot 10 is controlled).

When the movement of transfer robot 10 is thus controlled by robot controller 40 (i.e., when the transfer position is thus corrected), a wafer W can be supplied to a process chamber 3 in a state in which the center of wafer W is substantially aligned, even if blade 11, on which wafer W was placed, was not correctly aligned when wafer W was placed on it.

That is, in accordance with an embodiment of the invention, blade 11 of transfer robot 10, on which a wafer W is placed, is minutely moved by an amount equal to the center alignment correction value by focusing a criterion for center alignment of wafer W entering a process chamber 3 on the center of wafer W.

Figure 6:
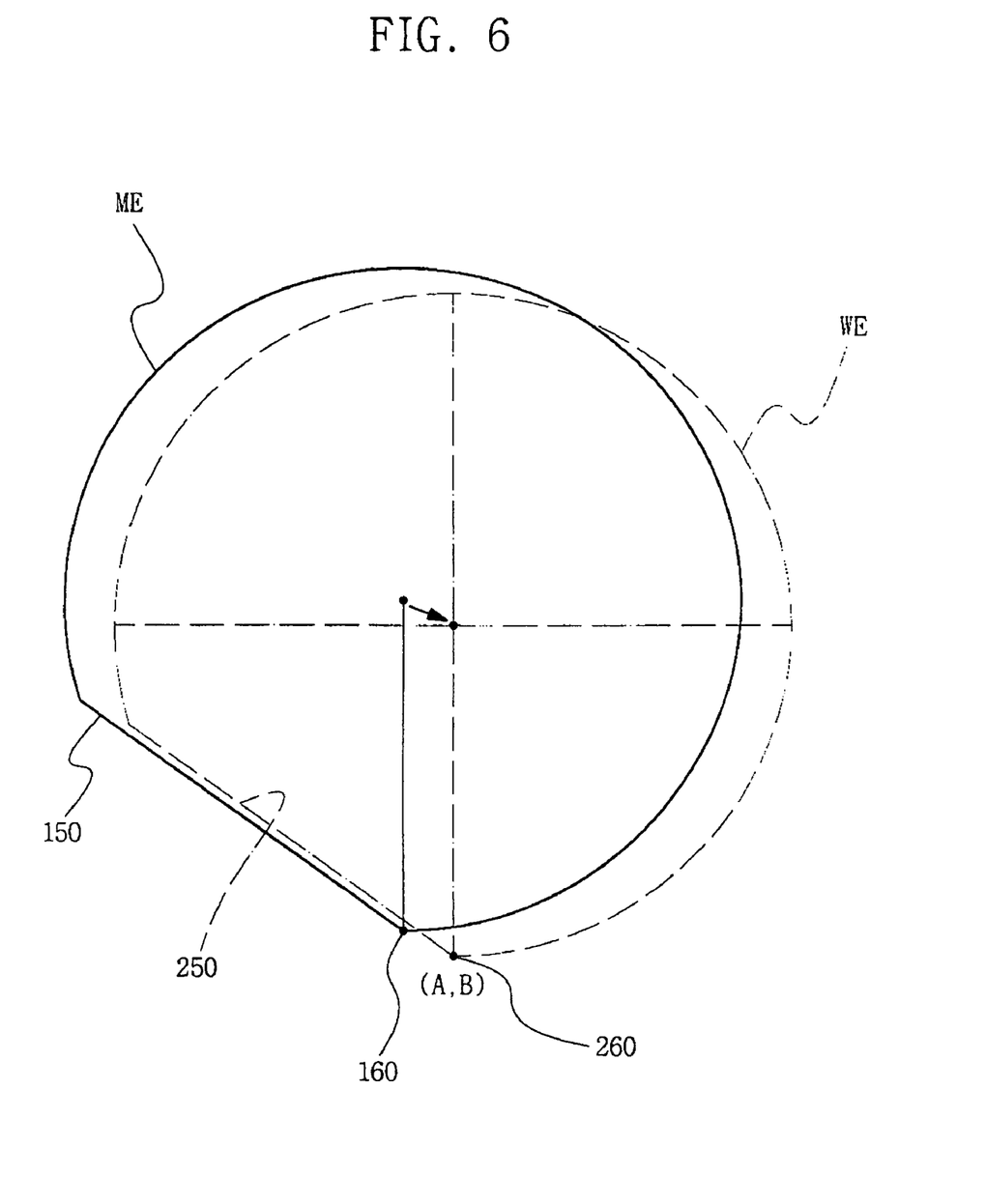
FIG. 6 is a plan view showing a wafer image of a wafer that is being transferred and that is displaced horizontally, but not rotated, relative to a master image; and, FIG. 7 is a plan view showing a wafer image of a wafer that is being transferred and that is displaced horizontally and rotated relative to a master image.
Figure 7:
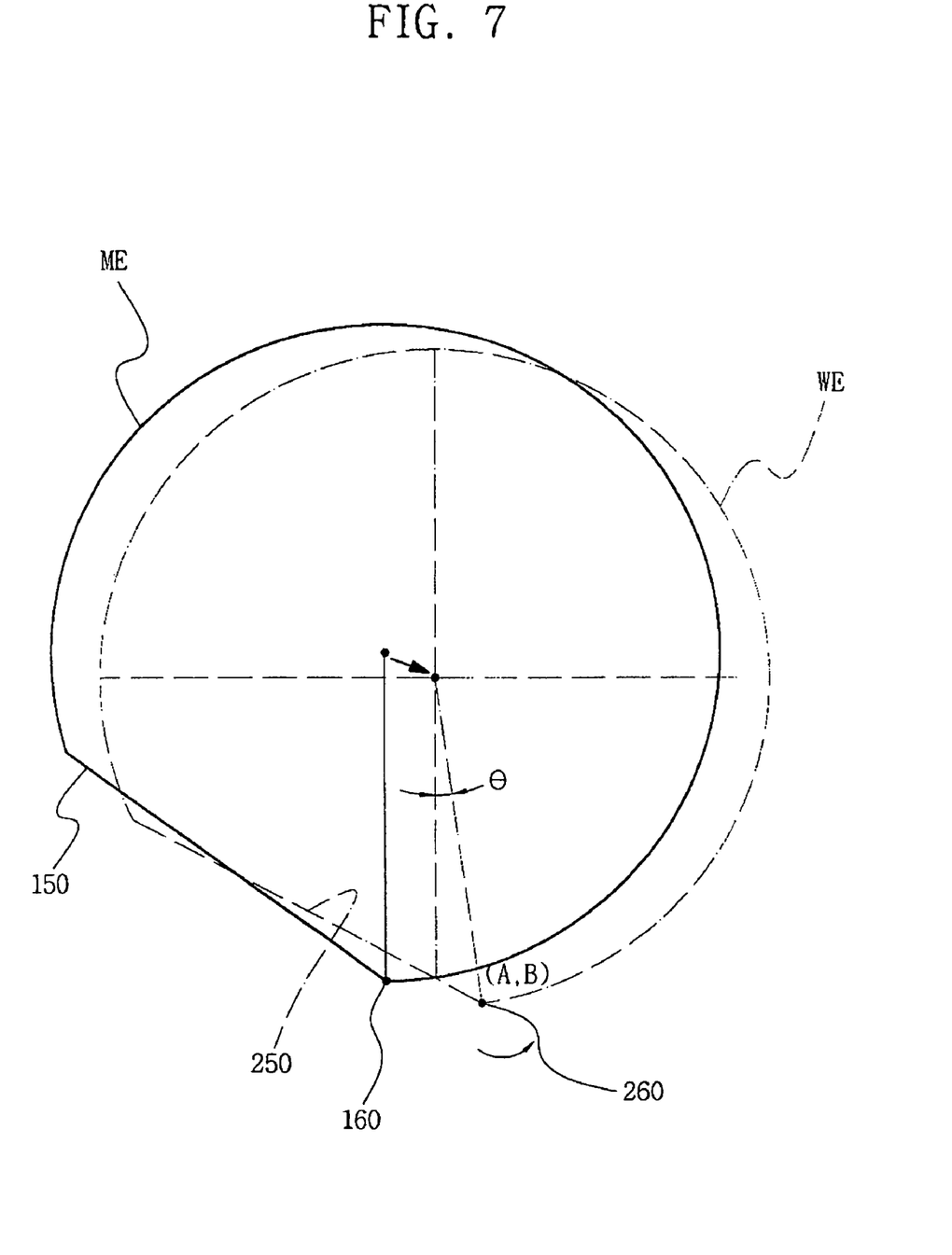

FIG. 6 is a plan view showing a wafer image WE of a wafer W that is being transferred and that is displaced horizontally, but not rotated, relative to a master image ME. FIG. 7 is a plan view showing a wafer image WE of a wafer W that is being transferred and that is displaced horizontally and rotated compared to a master image ME.

Referring to FIGS. 6 and 7, if a wafer image WE, which is converted into digital signals by CCD camera 23, is checked by signal processing unit 30, the coordinates (A, B) of an apex 260 of a flat zone 250 and the position of a segment of flat zone 250 can be acquired from wafer image WE.

Accordingly, the difference in position (dx, dy) between apex 260 of wafer image WE and an apex 160 of a flat zone 150 of master image ME, and an angle θ of rotational difference between the orientations of wafer image WE and master image ME (i.e., a flat zone angle difference θ) can be detected by comparing wafer image WE to master image ME.

A wafer center difference for wafer W is calculated using the detected coordinates (A, B) of apex 260 of wafer image WE, flat zone angle difference θ, and sets of equations stored in signal processing unit 30. The equations are shown below as Set of Equations 1 and Set of Equations 2. Also, in FIGS. 6 and 7, apex 160 of master image ME is defined as the origin (0, 0) of a coordinate system used for wafer image WE and master image ME.

Set of Equations 1 may be used to calculate the coordinates of the center of a wafer W. Set of Equations 1 comprises:

$$Wx = -\text{Sin}(\theta) \times 100 + A + 100; \text{ and}$$

$$Wy = \text{Cos}(\theta) \times 100 + B.$$

In Set of Equations 1, (Wx, Wy) are coordinates of the center of wafer W corresponding to wafer image WE, and the angle θ is the flat zone angle difference θ between the flat zone angles of wafer image WE and master image ME. Angle θ is also the angle of rotational difference between the orientation of wafer W represented by wafer image WE and the orientation of master image ME. In addition, coordinates (A, B) are the coordinates of apex 260 of flat zone 250 of wafer W (i.e., wafer image WE). Also, Wx and A are each values along a first axis (X-axis) and Wy and B are each values along a second axis (Y-axis).

Set of Equations 1 illustrates formulae used to calculate the value of the center of a wafer W having a diameter of 200 mm (i.e., having a diameter of about 8-inches). The value 100 in Set of Equations 1 denotes the radius of wafer W.

When the alignment of a wafer W is such that there is no rotational difference between wafer W and master image ME, the wafer center difference for wafer W is equal to (A, B). That is, the wafer center difference for wafer W is equal to A along the first axis and B along the second axis.

A method of calculating a change value of the center coordinate of the picked-up wafer image WE is as follows.

Assuming that the wafer is displaced by amounts of displacement Δx and Δy, final center coordinates Wx and Wy of the wafer W are calculated in accordance with the following equations:

$$Wx = -\sin(\theta) \times 100 + \Delta x + 100; \text{ and}$$

$$Wy = \cos(\theta) \times 100 + \Delta y.$$

The angle θ is the flat zone angle difference θ between the flat zone angles of wafer image WE and master image ME. In addition, in the above expression, the (x, y) coordinate of apex 160 of flat zone 150 of master image ME is defined as the origin (0, 0) of the coordinate system used for wafer image WE and master image ME.

Thus, signal processing unit 30 calculates a wafer center difference using the coordinates (A, B) of apex 260 wafer image WE of wafer W, and the flat zone angle difference θ, each obtained by comparing wafer image WE with master image ME.

The inclination angle of a wafer W should be measured precisely when using the above equations. If the wafer center difference for wafer W is equal to the difference in position between apex 260 of wafer image WE of wafer W and apex 160 of master image ME, then there is no rotational difference between wafer W and master image ME. However, if there is a rotational difference between the respective orientations of wafer image WE of wafer W and master image ME, then the flat zone angle difference θ (i.e., the angle θ of rotational difference between wafer image WE and master image ME) should be determined precisely in order to calculate the coordinates of the center of wafer W.

Since the coordinate (0, 0) as a reference for calculation of the wafer center change value is one apex of a flat zone of a wafer as mentioned above, the angle of the flat zone serves as a greatest parameter for calculation of a center value of the wafer according to the amount of addition or subtraction of the angle θ to/from the apex.

Accordingly, to accurately calculate the wafer center difference, it is important to accurately determine the coordinates (A, B) of apex 160 of wafer image WE of wafer W (i.e., the difference in position between apex 160 of wafer W and apex 260 of master image ME) and flat zone angle difference θ between wafer image WE of wafer W and master image ME.

Embodiments of the invention have been described herein with reference to a wafer W having a flat zone. However, wafer center alignment may be performed on a wafer W, on which a mark is formed, by using the mark in place of an apex of a flat zone. That is, although in previously-described embodiments a flat zone is formed in a wafer W as a reference for orientation of wafer W (i.e., to give wafer W directivity), a notch may be formed in wafer W or a particular mark may be formed on a portion of the edge of a wafer W and wafer center alignment similar to that described above may be performed using the mark in place of an apex of a flat zone.

Further, although previously-described embodiments were described with reference to wafers W having diameters of about 8 inches, embodiments of the invention may also use wafers having diameters of about 12 inches. Wafers having diameters of about 12 inches have recently been produced for the purpose of improving the productivity of semiconductor fabrication processes.

In accordance with an embodiment of the invention, imaging unit 20, which is adapted to take an image of wafer W as it is being transferred, may be disposed on a window of slit valve door module 5, which is disposed between a load lock chamber 2 and transfer chamber 1. In addition, robot controller 40, which is adapted to drive transfer robot 10, is provided separately from signal processing unit 30. Thus, embodiments of the invention may be readily applied to the existing unit process apparatuses (i.e., facilities) with relatively few changes. That is, all additional components of embodiments of the invention are provided outside of the components of the existing facilities, except for the relatively minor addition of a robot control program to robot controller 40 so that robot controller 40 can finely (i.e., minutely) control the driving of transfer robot 10.

In addition, the wafer center difference for a wafer W that is being transferred from a load lock chamber 2 to a process chamber 3 is calculated so that driving of transfer robot 10 can be controlled precisely (i.e., exactly) in accordance with the wafer center difference, which may be used as a center alignment correction value for wafer W. Accordingly, wafer center alignment can be performed on a wafer W simply by controlling the driving of transfer robot 10 as it transfers wafer W from a load lock chamber 2 to a process chamber 3 without having to provide wafer W to an aligning chamber 4 before wafer W is provided to process chamber 3. That is, transfer robot 10 loads wafer W into process chamber 3 such that the center of wafer W is substantially aligned so that a process performed in process chamber 3 can be performed safely.

In accordance with an embodiment of the invention, an image (i.e., a wafer image) is taken of a wafer that is being transferred from a load lock chamber to a transfer chamber in order to determine the wafer center difference for the wafer. The wafer center difference is then calculated by a process comprising comparing the wafer image to a master image, and the driving of a transfer robot is then controlled in accordance with a center alignment correction value corresponding to the calculated wafer center difference so that the wafer can be loaded into a process chamber with its center substantially aligned.

Because the wafer may not pass through an aligning chamber between being withdrawn from the load lock chamber and being provided to the process chamber, the transfer route for the wafer may be shortened. In particular, in accordance with an embodiment of the invention, since a wafer may be loaded to a process chamber from a load lock chamber without passing through an aligning chamber, process execution time can be shortened, process execution efficiency can be improved, and the productivity of the process can be improved.

Although embodiments of the invention have been described herein, various modifications may be made to the embodiments by one of ordinary skill in the art without departing from the scope of the invention as defined by the accompanying claims.

What is claimed is:

1. A wafer aligning apparatus comprising:
   a laser sensor adapted to generate a trigger signal;
   an illuminator adapted to illuminate a wafer being transferred by a transfer robot from a cassette disposed in a load lock chamber to a transfer chamber, wherein the illuminator is adapted to illuminate the wafer in accordance with the trigger signal;
   a Charge-Coupled Device (CCD) camera adapted to take an image of the wafer in accordance with the trigger signal and adapted to convert the image into digital signals;
   a signal processing unit adapted to calculate a center alignment correction value for the wafer by comparing the digital signals to a master image stored in the signal processing unit; and,
   a robot controller adapted to receive the center alignment correction value from the signal processing unit and control movement of a transfer robot in accordance with the center alignment correction value,
   wherein the laser sensor is adapted to generate the trigger signal in accordance with a substantial change in an amount of reflected light detected by the laser sensor, and the substantial change in the amount of reflected light detected by the laser sensor occurs after a boundary between a robot arm of the transfer robot and a coupler of the transfer robot passes under the laser sensor, wherein the robot arm has a first color and the coupler has a second color different than the first color.

2. The wafer aligning apparatus of claim 1, wherein the laser sensor is disposed on a window of a slit valve door module disposed between the load lock chamber and the transfer chamber.

3. The wafer aligning apparatus of claim 1, wherein the illuminator comprises a flash lamp.

4. The wafer aligning apparatus of claim 1, wherein the illuminator is adapted to begin operating when the trigger signal is generated.

5. The wafer aligning apparatus of claim 1, wherein the illuminator is adapted to begin operating after a predetermined amount of time has lapsed since the generation of the trigger signal.

6. The wafer aligning apparatus of claim 1, wherein the illuminator is disposed on a window of a slit valve door module disposed between the load lock chamber and the transfer chamber.

7. The wafer aligning apparatus of claim 1, wherein the CCD camera is adapted to begin operating when the trigger signal is generated.

8. The wafer aligning apparatus of claim 1, wherein the CCD camera and the illuminator are adapted to begin operating simultaneously.

9. The wafer aligning apparatus of claim 1, wherein the CCD camera is adapted to begin operating after a predetermined amount of time has lapsed since the generation of the trigger signal.

10. The wafer aligning apparatus of claim 1, wherein the CCD camera is disposed on a window of a slit valve door module disposed between the load lock chamber and the transfer chamber.

11. The wafer aligning apparatus of claim 1, wherein the laser sensor, the illuminator, and the CCD camera are disposed on a window of a slit valve door module disposed between the load lock chamber and the transfer chamber.

12. A wafer aligning method for aligning a wafer using a wafer aligning apparatus, the wafer aligning apparatus comprising:
   a laser sensor adapted to generate a trigger signal;
   an illuminator adapted to illuminate a wafer being transferred by a transfer robot from a cassette disposed in a load lock chamber to a transfer chamber, wherein the illuminator is adapted to illuminate the wafer in accordance with the trigger signal;
   a Charge-Coupled Device (CCD) camera adapted to take an image of the wafer in accordance with the trigger signal and adapted to convert the image into digital signals;
   a signal processing unit adapted to calculate a center alignment correction value for the wafer by comparing the digital signals to a master image stored in the signal processing unit; and,
   a robot controller adapted to receive the center alignment correction value from the signal processing unit and control movement of the transfer robot in accordance with the center alignment correction value,
   the wafer aligning method comprising:
   withdrawing the wafer from the cassette using the transfer robot;
   generating the trigger signal using the laser sensor when the wafer is being transferred from the cassette disposed in the load lock chamber to the transfer chamber;
   taking an image of the wafer disposed on the transfer robot in accordance with the generation of the trigger signal;
   converting the image of the wafer into digital signals;
   detecting coordinates of a first apex of a flat zone of the wafer image, and detecting a flat zone angle of the wafer image;
   calculating a flat zone angle difference between respective flat zone angles of the wafer image and the master image by comparing the digital signals with the master image;
   calculating coordinates of a center of a wafer image;
   calculating a wafer center difference;
   comparing the wafer center difference to a stored first limit and comparing the flat zone angle difference to a stored second limit;
   if the wafer center difference exceeds the first limit or the flat zone angle difference exceeds the second limit:
      providing the wafer to an aligning chamber using the transfer robot, aligning the wafer, and providing the wafer to the process chamber as aligned; and,
   if the wafer center difference is below the first limit and the flat zone angle is below the second limit:
      calculating the center alignment correction value for the transfer robot in accordance with the wafer center difference; and,
      controlling the movement of the transfer robot in accordance with the center alignment correction value to load the wafer into the process chamber such that the center of the wafer is substantially aligned.

13. The wafer aligning method of claim 12, wherein the laser sensor is adapted to generate the trigger signal in accordance with a substantial change in an amount of light reflected from the transfer robot, as detected by the laser sensor.

14. The wafer aligning method of claim 13, wherein the substantial change in the amount of light reflected from the transfer robot occurs when a boundary between a robot arm of the transfer robot and a coupler of the transfer robot passes under the laser sensor, wherein the robot arm has a first color and the coupler has a second color different than the first color.

15. The wafer aligning method of claim 12, wherein taking an image of the wafer comprises illuminating the wafer using the illuminator.

16. The wafer aligning method of claim 12, wherein taking the image of the wafer is performed after a predetermined amount of time has lapsed since the generation of the trigger signal.

17. The wafer aligning method of claim 12, wherein the coordinates of the center of the wafer image are calculated in accordance with the following equations:

$$Wx=-\mathrm{Sin}(\theta)\times 100+A; \text{ and,}$$

$$Wy=\mathrm{Cos}(\theta)\times 100+B,$$

wherein (Wx, Wy) represents the center coordinate of the wafer image, θ is the flat zone angle difference between the respective flat zone angles of the wafer image and the master image, and (A, B) are the coordinates of the first apex of the wafer image.

18. The wafer aligning method of claim 12, wherein the wafer center (Wx, Wy) is calculated in accordance with the equations:

$$Wx=-\mathrm{Sin}(\theta)\times 100+\Delta x+100; \text{ and,}$$

$$Wy=\mathrm{Cos}(\theta)\times 100+\Delta y,$$

where Δx and Δy are displacement amounts of the wafer and θ is the flat zone angle difference between the respective flat zone angles of the wafer image and the master image.

19. The wafer aligning method of claim 12, wherein an apex of a flat zone of the master image is the origin of the coordinates in which the coordinates of the center of the wafer image are calculated.

* * * * *